(12) United States Patent
McAdams et al.

(10) Patent No.: US 7,933,138 B2
(45) Date of Patent: Apr. 26, 2011

(54) F-RAM DEVICE WITH CURRENT MIRROR SENSE AMP

(75) Inventors: Hugh P. McAdams, McKinney, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 50 days.

(21) Appl. No.: 12/362,972

(22) Filed: Jan. 30, 2009

(65) Prior Publication Data

US 2010/0195368 A1    Aug. 5, 2010

(51) Int. Cl.
*G11C 11/22* (2006.01)

(52) U.S. Cl. ............... 365/145; 365/149; 365/189.09; 365/196; 365/202; 365/207

(58) Field of Classification Search .......... 365/145, 365/149, 189.09, 196, 202, 207
See application file for complete search history.

(56) References Cited

U.S. PATENT DOCUMENTS

| | | | |
|---|---|---|---|
| 6,487,130 B2 * | 11/2002 | Endo et al. ............... | 365/189.09 |
| 6,510,071 B2 * | 1/2003 | Oowaki ..................... | 365/145 |
| 6,525,956 B2 * | 2/2003 | Murakuki ................. | 365/145 |
| 6,538,915 B2 * | 3/2003 | Endo et al. ................ | 365/145 |
| 6,566,698 B2 * | 5/2003 | Nishihara et al. ......... | 257/295 |
| 6,707,700 B2 * | 3/2004 | Kang ......................... | 365/145 |
| 6,970,371 B1 | 11/2005 | Summerfelt et al. | |
| 6,980,458 B2 * | 12/2005 | Demange et al. ......... | 365/145 |
| 7,180,766 B2 * | 2/2007 | Morita ....................... | 365/145 |
| 7,200,029 B2 * | 4/2007 | Yoshioka ................... | 365/145 |
| 7,269,047 B1 * | 9/2007 | Fong et al. ................ | 365/104 |
| 7,443,714 B1 * | 10/2008 | Kim .......................... | 365/149 |
| 7,675,795 B2 * | 3/2010 | Koyama .................... | 365/192 |

OTHER PUBLICATIONS

Siu et al., "A Current-Based Reference-Generation Scheme for 1T-1C Ferroelectric Random-Access Memories", IEEE Journal of Solid-State Circuits, Mar. 2003, vol. 38, No. 3, pp. 541-549.
Siu et al., "A 16kb 1T1C FeRAM Testchip Using Current-Based Reference Scheme", IEEE Custom Integrated Circuits Conference, 2002, pp. 107-110.

* cited by examiner

*Primary Examiner* — Viet Q Nguyen
(74) *Attorney, Agent, or Firm* — Rose Alyssa Keagy; Wade J. Brady, III; Frederick J. Telecky, Jr.

(57) ABSTRACT

A F-RAM memory device containing a current mirror sense amp. A F-RAM memory device containing a current mirror sense amp coupled to a negative voltage generator. A method of reading data from and restoring data back into F-RAM cells in a 2T2C F-RAM device containing a current mirror sense amp. A method of reading data from and restoring data back into F-RAM cells in a 1T1C F-RAM device.

10 Claims, 6 Drawing Sheets

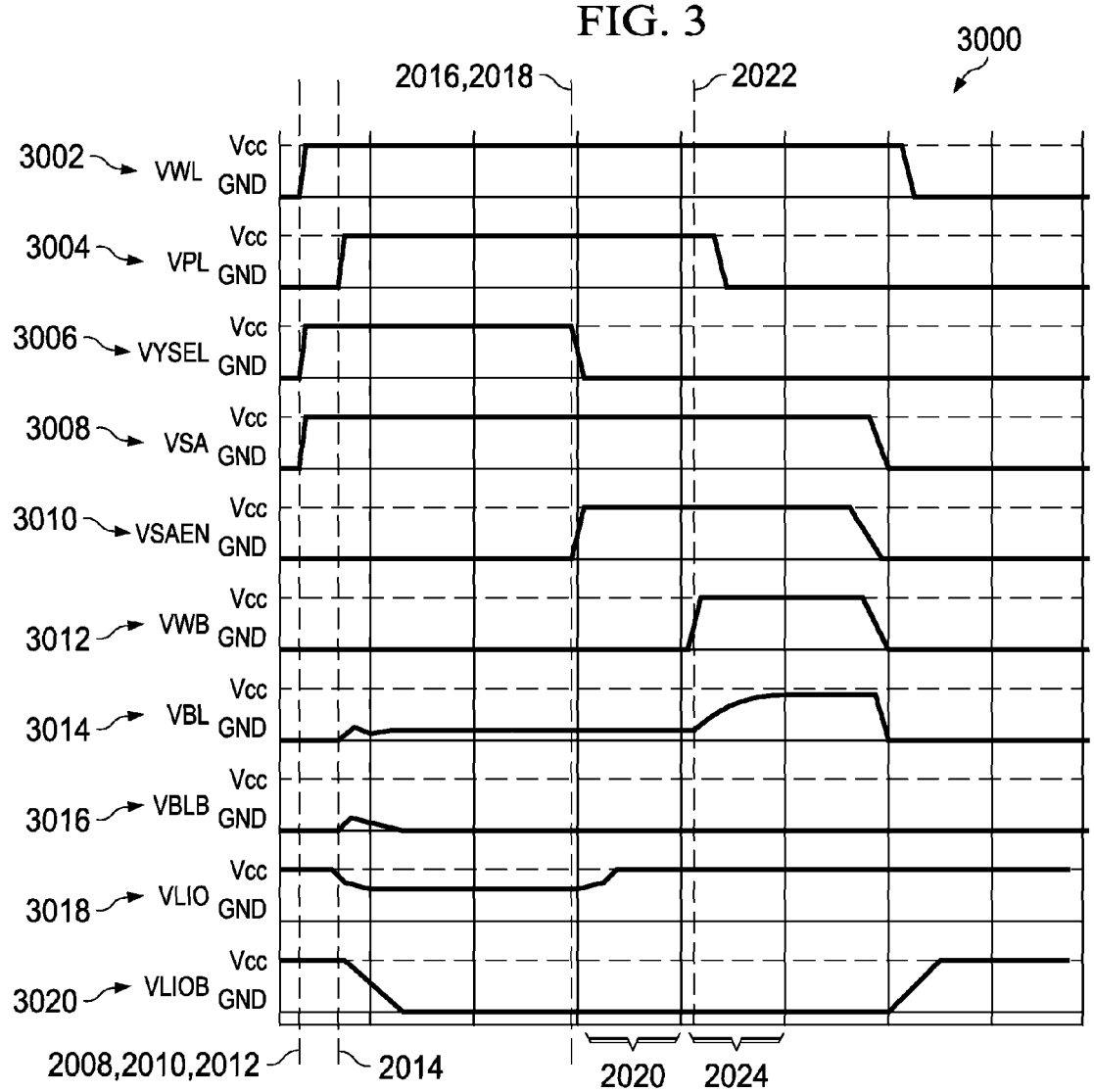

F-RAM DEVICE WITH CURRENT MIRROR SENSE AMP

FIELD OF THE INVENTION

This invention relates to the field of integrated circuits. In particular, this invention relates more generally to the field of memory devices and more specifically to the sense amp in a F-RAM memory device.

DESCRIPTION OF THE VIEWS OF THE DRAWING

FIG. 3 contains timing diagrams of the voltage signals during the read and restore operations of a ferroelectric memory device in accordance with this invention.

DETAILED DESCRIPTION

Figure 1:
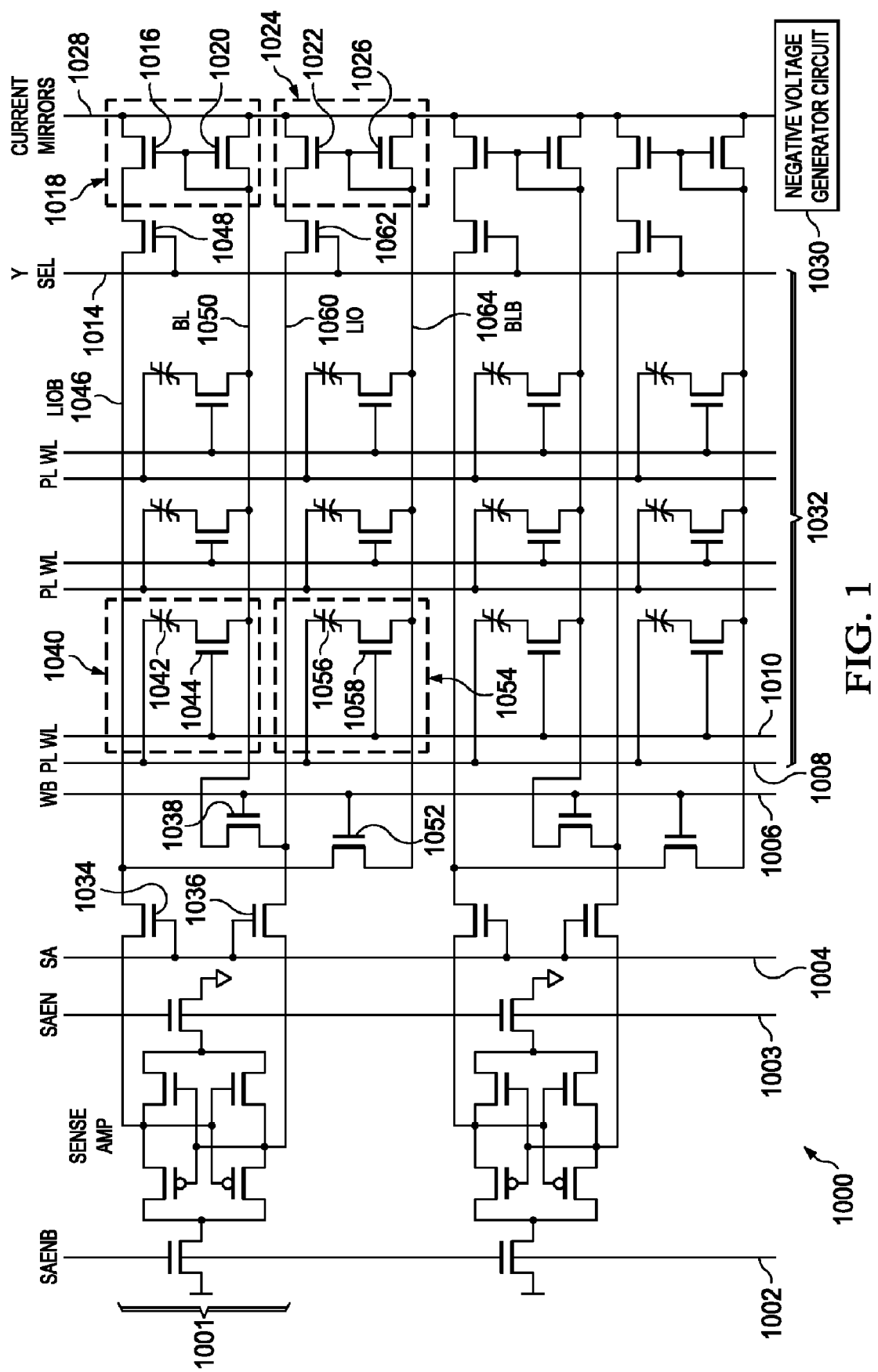
FIG. 1 is a 2T2C ferroelectric memory device with current mirrors in accordance with this invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The invention relates to a current mirror sense amp structure and circuit for reading ferroelectric random access memory ("F-RAM") data that facilitates the rapid development of a rail to rail voltage across the differential sense amp for reduced read time and reduced read errors. Various aspects of the invention are hereinafter illustrated and described in the context of an exemplary folded bitline type F-RAM device having two transistor, two capacitor (e.g., "2T2C") and one transistor, one capacitor (e.g., "1T1C") cells with plate groups in which several rows of cells share a common plate-line driver. However, it is within the scope of the invention to use any type of cell structure, any type of array architecture (e.g., folded bitline, open bitline, etc.), and having grouped or individually driven platelines.

For purposes of this disclosure, the term "cell read voltage" refers to the voltage across a ferroelectric capacitor (i.e. 1042 and 1056 in FIG. 1) during the data sense operation.

In this disclosure, when the data state in the F-RAM cell is a "1", positive charge is transferred to the bitline when the plate line is switched and a cell read voltage is applied. When the data state in the F-RAM cell is a "0", little positive charge is transferred to the bitline when the cell read voltage is applied.

An exemplary 2T2C F-RAM device (1000) having current mirror circuits (ie. 1018 and 1024) is illustrated in FIG. 1 in accordance with one or more aspects of the invention. The device (1000) comprises a folded bitline array (1032) of 2T2C F-RAM cells (ie. 1040 and 1054) arranged in rows along word lines, WL (1010), and platelines, PL (1008), and in columns along complementary array bitline pairs, BL (1050) and BLB (1064). BL (1050) and BLB (1064), are connected to the current mirror common node line (1028) through first current mirror transistor (1020) and third current mirror transistor (1026) respectively. YSEL line (1014) turns on first YSEL transistor (1048) to connect local I/O line, LIOB (1046), to the second current mirror transistor (1016) and also turns on second YSEL transistor (1062) to connect local I/O line, LIO (1060) to the fourth current mirror transistor (1022). SA line (1004) controls the first sense amp select transistor (1034) which connects local I/O line, LIOB (1046) to one input of the sense amp (1001) and also controls the second sense amp select transistor (1036) which connects local I/O line, LIO (1060) to the other input of the sense amp (1001). Sense amp enable signals, SAEN (1003) and SAENB (1002), activate the sense amp during the read operation.

In a 2T2C F-RAM device, one of the F-RAM cells (1040) and (1054) stores a "0" and the other cell stores a "1". For illustrative purposes in the following description it is assumed that F-RAM cell (1040) contains a data "1" and F-RAM cell (1054) a data "0". When a 2T2C F-RAM cell is read, a differential voltage is developed across the inputs of sense amp (1001) in response to the data from F-RAM cells (1040) and (1054). The read operation disturbs the polarization state of the F-RAM capacitor (1042) that stores the "1". The "0" in F-RAM capacitor (1056) is not disturbed by the read. Write back circuitry consisting in part of a write back line, WB (1006), which controls the first write back transistor (1038) that connects BL (1050) to LIO (1060) and also controls the second write back transistor (1052) that connects BLB (1064) to LIOB (1046) is utilized to restore the "1" in F-RAM cell (1040). The current mirror common node line (1028) may be grounded or a negative voltage generator circuit (1030) may be used to apply a voltage to current mirror common node line (1028). It may be advantageous to apply a slightly negative voltage to the current mirror common node line (1028) to maintain the voltage on the bitlines, (1050) and (1064), near ground or slightly negative during pulsing of the PL (1008) to increase the voltage across the F-RAM capacitors (1042) and (1056) during read. When word line (1010) turns on, cell select transistors (1044) and (1058) connect F-RAM capacitors (1042) and (1056) to BL (1050) and BLB (1064) respectively, and capacitive charge is transferred from the F-RAM capacitors, (1042) and (1056), to the bitlines making the voltage on the bitlines slightly positive. Any positive voltage on BL (1050) and BLB (1064) reduces the cell read voltage across the F-RAM capacitors (1042) and (1056). A negative voltage on current mirror common node line (1028) pulls the voltage on BL (1050) and BLB (1064) to near ground or slightly negative, thereby providing an increased cell read voltage across the ferroelectric capacitors (1042) and (1056) during the read. FIG. 1 shows the sense amp (1001) connected to one F-RAM memory array column through sense amp select transistors (1034) and (1036). However, multiple F-RAM memory array columns (not shown) may share the same sense amp through additional sense amp select transistors (not shown) to reduce the area of the F-RAM array.

Figure 2:
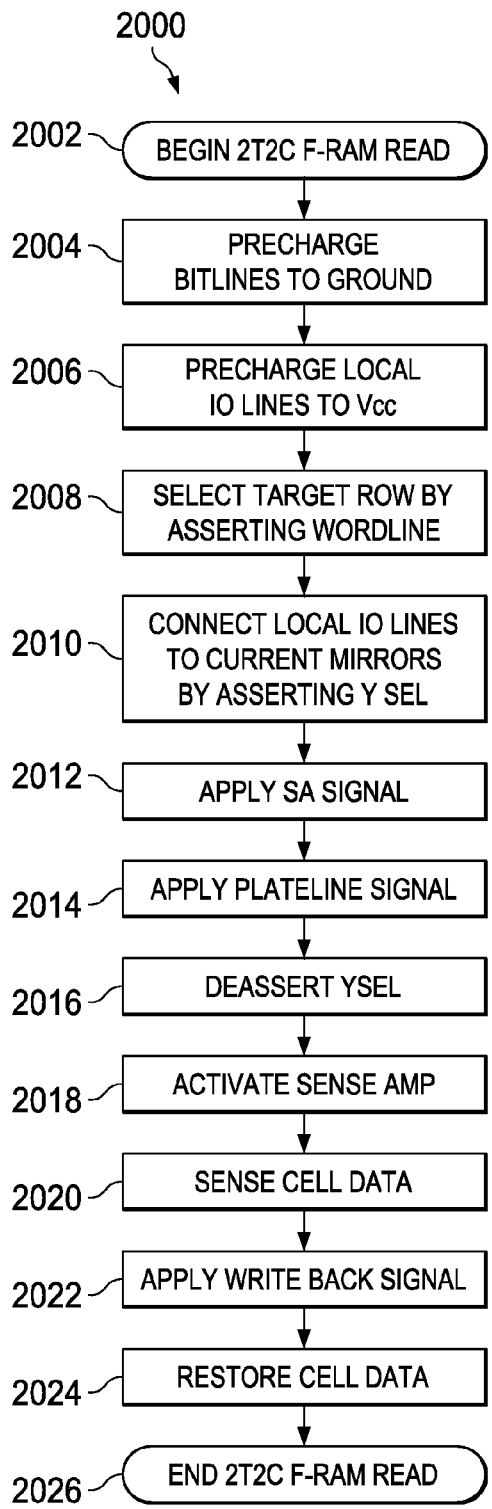
FIG. 2 is a flow diagram of the read and restore operation of a 2T2C ferroelectric memory device in accordance with this invention.

FIG. 2 is a flow diagram of the read operation of the ferroelectric memory device (1000) according to this invention.

FIG. 3 gives voltage timing diagrams describing the operation of the ferroelectric memory device (1000) in FIG. 1.

Referring now to the operational flow chart (2000) in FIG. 2, the 2T2C F-RAM read begins with precharging (step 2004) BL (1050) and BLB (1064) to ground and precharging (step 2006) LIO (1060) and LIOB (1046) to the power supply voltage, Vcc. (Precharging circuits are not shown in FIG. 1). Therefore as shown in FIG. 3, at the start of the F-RAM read operation, the BL voltage, VBL (3014), and the BLB voltage, VBLB (3016), have been precharged (step 2004) to ground. In addition the LIO voltage, VLIO (3018), and LIOB voltage, VLIOB (3020), have been precharged (step 2006) to Vcc.

F-RAM memory cell pair (1040) and (1054) are then connected to BL (1050) and BLB (1064) respectively by bringing the voltage, VWL (3002), on WL (1010) high (step 2008) to turn on cell select transistors (1044) and (1058).

SA (1004) is asserted (step 2012) to connect LIOB (1046) and LIO (1060) to the sense amp (1001). At about the same time, the signal on YSEL (1014), VYSEL (3006), is asserted (step 2010) to connect LIOB (1046) to the current mirror (1018) through first YSEL transistor (1048) and to connect LIO (1060) to the current mirror (1024) through second YSEL transistor (1062). YSEL may be asserted prior to or at approximately the same time the voltage on the PL (1008), VPL (3004), is switched high (step 2014).

When PL (1008) is switched high, capacitance from the F-RAM cells (1042) and (1056) causes the bitline voltage, VBL (3014), and the bitline bar voltage, VBLB (3016), to rise slightly as shown in FIG. 3. The negative voltage applied by negative voltage generator circuit (1030) to line (1028) removes this charge through first and third current mirror transistors (1020) and (1026), returning VBL (3014) and VBLB (3016) substantially to ground or slightly negative. This enhances the cell read voltage across the F-RAM capacitors (1042) and (1056) thereby improving the read speed and read reliability. The negative voltage from the negative voltage generator circuit (1030) may be common across all current mirrors to reduce variability.

The charge transferred from F-RAM capacitor (1042) with a data state "1" to the BL (1050) will cause current to flow through first current mirror transistor (1020). Since the gates of the first (1020) and second (1016) current mirror transistors are connected together, when current flows through first current mirror transistor (1020) then a proportional current also flows through second current mirror transistor (1016) causing VLIOB (3020) to discharge as shown in FIG. 3. Since the data state of F-RAM capacitor (1056) is a "0", a smaller charge from the capacitance of capacitor (1056) is transferred to BLB (1064) causing a smaller current to flow through third current mirror transistor (1026) and also a smaller proportional current to flow through fourth current mirror transistor (1022). Consequently, VLIO (3018) is discharged to a lesser amount than VLIOB (3020) and remains nearer to Vcc. The width of second and fourth current mirror transistors (1016) and (1022) may be made wider than first and third current mirror transistors (1020) and (1026) to provide current amplification during sensing to additionally reduce read time. The ratio of the first (1020) and second (1016) current mirror transistor widths and the ratio of the third (1026) and fourth (1022) current mirror transistor widths is determined by layout area and circuit performance optimization considerations, but typically falls in the range of 1:2 to 1:4.

VYSEL (3006) is deasserted (step 2016) to isolate LIO (1060) and LIOB (1046) from the current mirrors (1018) and (1024) to prevent loading on the sense amp (1001). Sense amp (1001) is activated (step 2018) by applying sense amp enable signals VSAEN (3010) and its complementary signal, VSAENB (not shown), to SAEN (1003) and SAENB (1002). During the data sense operation (step 2020) the plateline voltage, VPL (3004) remains high as in "on-pulse sensing".

The initial data read operation, when PL (1008) is asserted (step 2012), disturbs the polarization state in F-RAM capacitor (1042) with a data "1" so the last steps in a F-RAM read are to restore the "1". The "0" in F-RAM capacitor (1056) is not disturbed when PL (1008) goes high. To restore the data, writeback line, WB (1006) voltage, VWB (3012) is selected (step 2022) to turn on first writeback transistor (1038) connecting BL (1050) to LIO (1060) and to turn on second writeback transistor (1052) connecting BLB (1064) to LIOB (1046). The plate voltage, VPL (3004) must be brought low while BL is taken high in order to restore the "1" (step 2024) into F-RAM capacitor (1042). This completes the read and restore operation (step 2026) of the 2T2C F-RAM device.

During the operation to restore a "1" (step 2024) into F-RAM capacitor (1042), a bitline restore circuit (not shown in FIG. 1) is required to drive BL (1050) to full Vcc level. This type of circuit is well known to those skilled in the relevant art and is omitted to avoid obscuring the invention. Alternatively, complementary SAB and WBB signals connected to complementary p-channel transistors (not shown) in parallel with sense amp select transistors (1034) and (1036) and in parallel with write back transistors (1038) and (1052) to form transmission gates may be used to drive BL (1050) to Vcc from the sense amp (1001). Another alternative is to drive SA (1004) and WB (1006) lines with a voltage greater than Vcc during the restore operation (step 2024), sufficient to overcome threshold voltage losses that would occur through the NMOS transistors (1034), (1036), (1038), and (1052).

Figure 4:
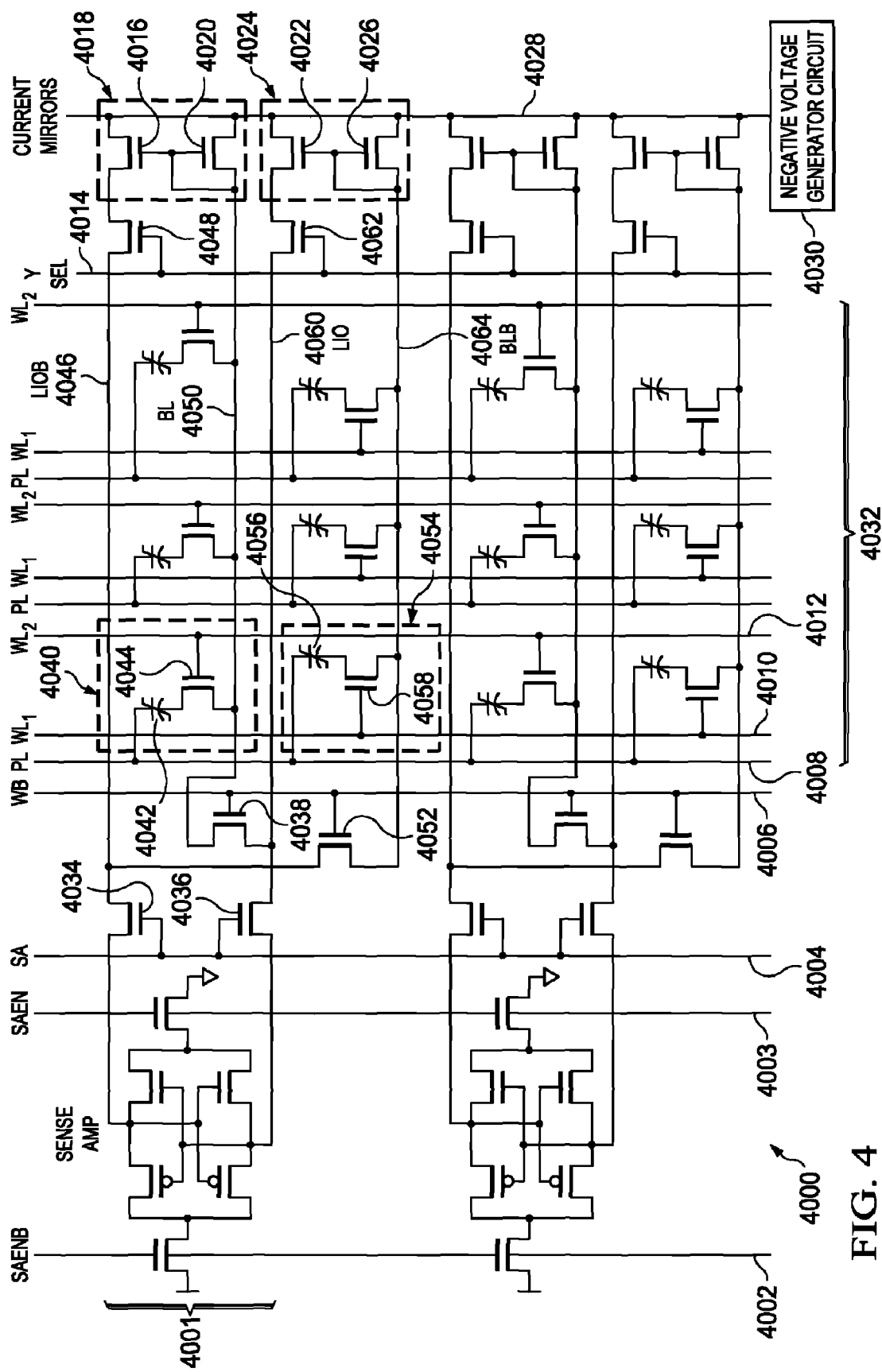
FIG. 4 is a 1T1C ferroelectric memory device with current mirrors in accordance with an embodiment of this invention.

An exemplary 1T1C F-RAM device (4000) having current mirror circuits (i.e. 4018 and 4024) is illustrated in FIG. 4 in accordance with one or more aspects of the invention. Although a 1T1C affords the obvious advantage of higher density, the 1T1C cell requires a reference voltage to be generated on chip and is less immune to noise and process variations. The instant invention improves the reading speed and reliability of the 1T1C F-RAM by providing a amplified differential voltage to the sense amp and by providing a higher cell read voltage during the read operation.

The 1T1C F-RAM in FIG. 4 is similar to the 2T2C F-RAM in FIG. 1 with the exception that a second word line, $WL_2$ (4012), has been added. In the 2T2C F-RAM (1000) in FIG. 1, the gates of F-RAM cell select transistors (1044) and (1058) are both connected to the word line, WL (1010), so that one F-RAM cell (1040) is connected to BL (1050) and a second oppositely polarized F-RAM cell (1054) is connected to BLB (1064) when WL (1010) is selected. In the 1T1C F-RAM (4000) in FIG. 4, the gate of the second cell select transistor (4058) is connected to word line, $WL_1$ (4010), and the gate of first cell select transistor (4044) is connected to word line, $WL_2$ (4012). In the 1T1C F-RAM (4000) one F-RAM cell (4054) is connected to a bitline, BLB (4064), when $WL_1$ (4010) is selected and no cell is connected to BL (4050). Because only one F-RAM cell (4054) is connected during a read operation in a 1T1C F-RAM device, a reference signal must be applied to the complementary read path consisting of bitline, BL (4050) and LIOB (4046), during the read of a 1T1C F-RAM.

Figure 5:
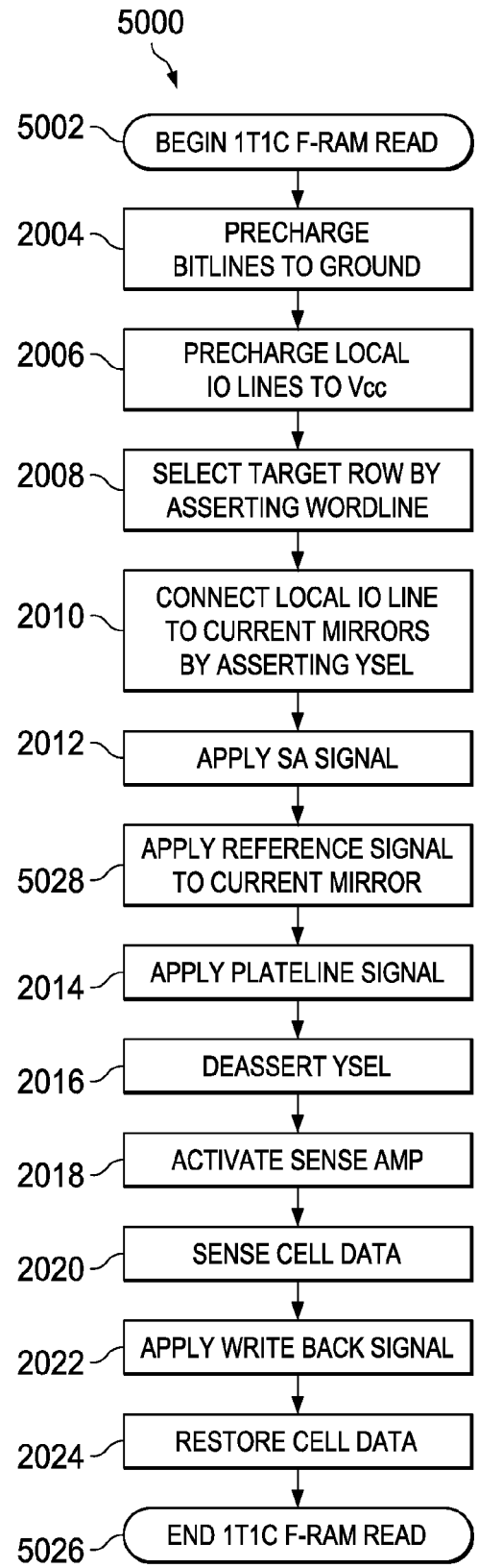
FIG. 5 is a flow diagram of a first embodiment of the read and restore operation of a 1T1C ferroelectric memory device in accordance with this invention.

As shown in FIG. 5, the steps (5000) to sense the data in a 1T1C F-RAM device (4000) are similar to the steps (2000) to sense the data in a 2T2C F-RAM circuit (1000) except for the application of a reference signal (step 5028) in FIG. 5. To read the 1T1C F-RAM device (4000) a reference current provided by a reference circuit (not shown) must be driven through either the first current mirror transistor (4020) or through the third current mirror transistor (4026) to provide the reference signal. This reference current must have a value between that produced by a "0" and that produced by a "1" in a accessed F-RAM bit cell. A value close to the average of the "0" and "1" signal is generally chosen. Although application of the reference signal (step 5026) is shown to occur before application of the plateline signal (step 2012) in FIG. 5, the order of these signals may be reversed or the signals may be applied at the same time.

As shown in FIG. 5, except for the application of the reference signal, data sensing follows the same steps as described for the 2T2C cell in FIG. 2. If the data in the selected F-RAM cell (4054) is a "1", more current flows through third current mirror transistor (4026) and connected fourth current mirror transistor (4022) than the reference current that flows through first current mirror transistor (4020) and connected second current mirror transistor (4016). This will cause local I/O line, LIO (4060), to discharge faster than LIOB (4046) causing the sense amp (4001) to latch with LIOB (4046) near Vcc. If, however, F-RAM cell (4040) is a "0", the reference signal will cause more current to flow through first current mirror transistor (4020) and connected second current mirror transistor (4016) than the "0" causes to flow through third current mirror transistor (4026) and connected fourth current mirror transistor (4022) causing LIOB (4046) to discharge faster than LIO (4060). In this instance, the sense amp (4001) latches with LIOB (4046) near ground. Second and fourth current mirror transistors, (4016) and (4022), may be sized larger than first and third current mirror transistors, (4020) and (4026), to provide amplification to improve read speed.

The data restore operation, (step 2020) and (step 2022) in FIG. 5, is similar to the data restore operation previously described for a 2T2C F-RAM device (1000) in FIG. 2. Writeback line, WB (4006), in FIG. 4 is selected to connect LIOB (4046) to BLB (4064) and LIO (4060) to BL (4050). F-RAM cell (4054) is connected to BLB (4064) when WL (4010) is selected so its data is restored. In this example, no F-RAM cell is electrically connected to BL (4050) so no other cell data is restored.

Figure 6:
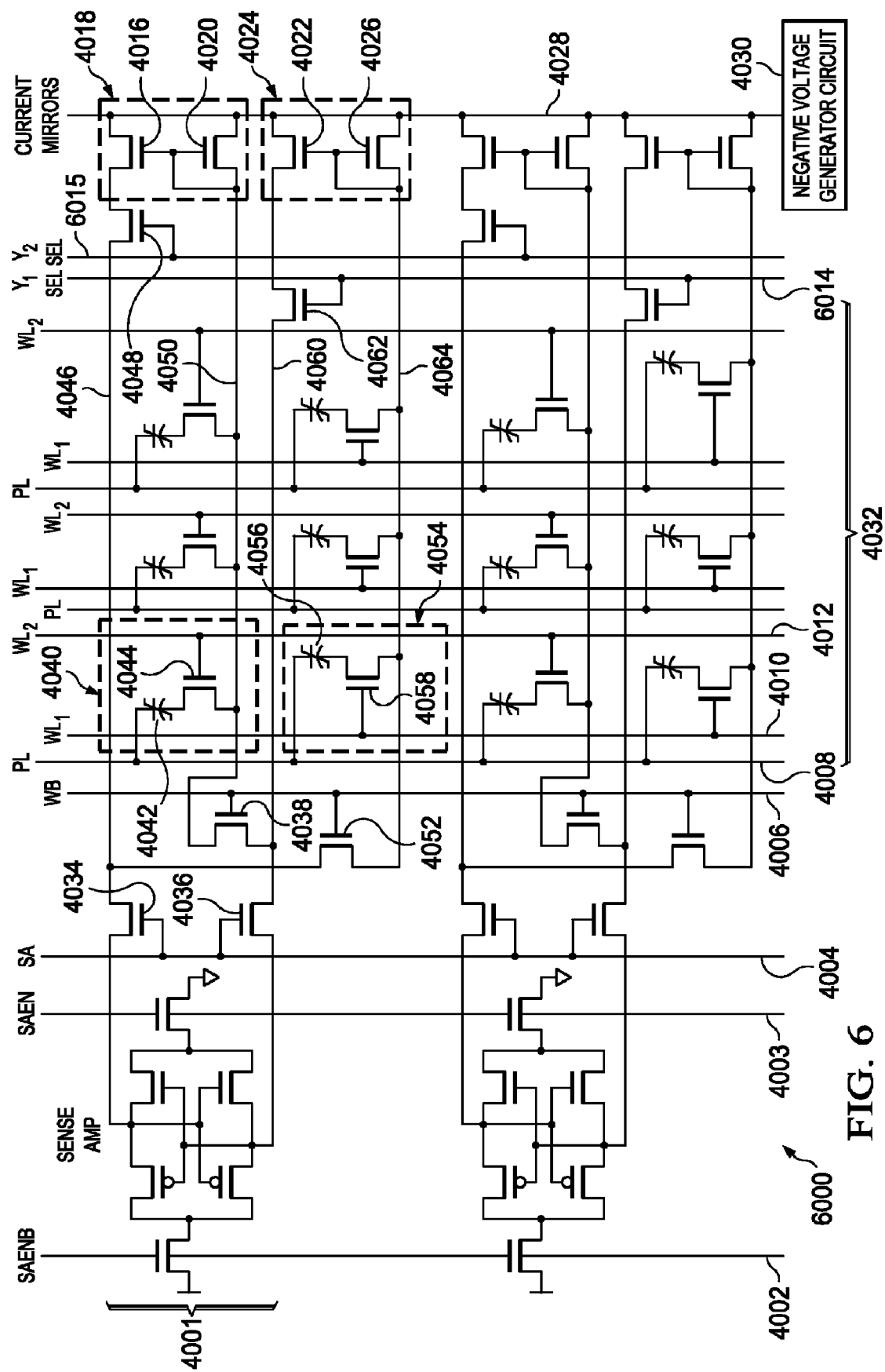
FIG. 6 is another embodiment of a 1T1C ferroelectric memory device with current mirrors in accordance with this invention.

Another embodiment of a 1T1C F-RAM device is shown in FIG. 6. This embodiment is the same as the 1T1C F-RAM device (4000) shown in FIG. 4 except that there are now two YSEL lines, $Y_1$ SEL (6014) and $Y_2$ SEL (6015). This change is to allow a reference voltage to be applied to one of the local I/O's while the read signal is being developed on the other local I/O. In the instance where $WL_1$ (4010) is selected connecting F-RAM cell (4054) to bitline (4064), the first YSEL line, $Y_1$ SEL (6014), is asserted to connect local I/O (4060) to current mirror (4024) through YSEL transistor (4062). This permits the read signal from F-RAM cell (4054) to develop on LIO (4060) through current mirror (4024). A reference signal, supplied by a reference signal circuit (not shown), is applied to LIOB (4046). Second YSEL line, $Y_2$ SEL (6015), is deasserted to isolate LIOB (4046) from current mirror (4018).

Figure 7:
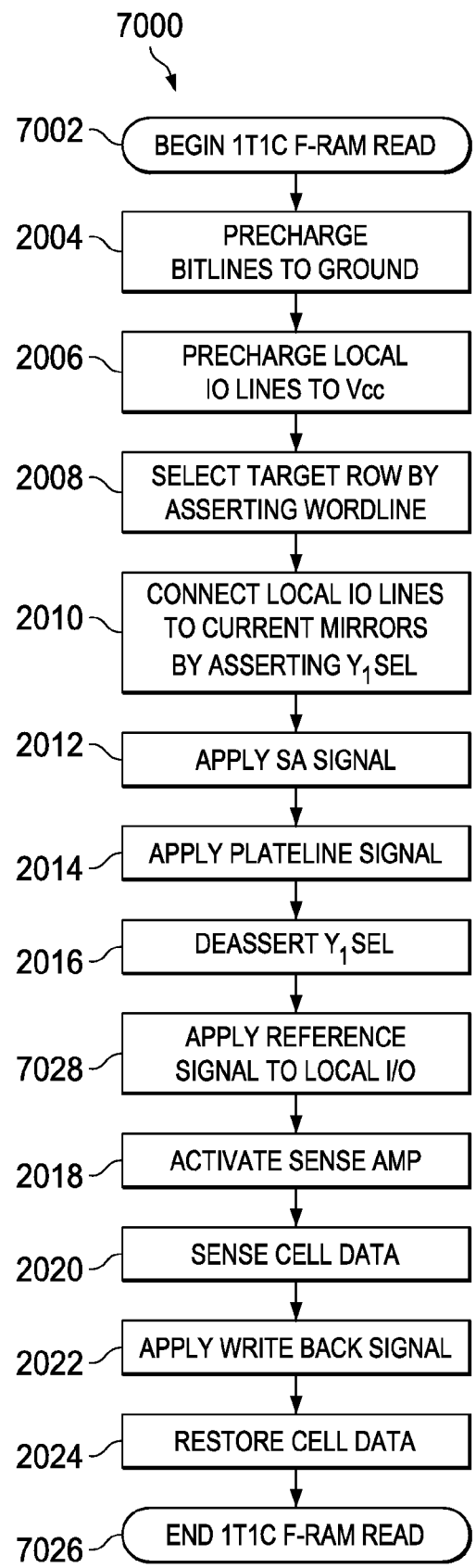
FIG. 7 is a flow diagram of the read and restore operation of the 1T1C ferroelectric memory described in FIG. 6.

The read procedure for the 1T1C F-RAM device (6000) is presented in FIG. 7. This read procedure (7000) is similar to the read procedure described previously in FIG. 5 (5000) except in this embodiment a reference voltage circuit (not shown in FIG. 6) applies a reference voltage (step 7028) directly to LIOB (4046). This reference voltage lies between the signal value produced by a "0" and a "1".

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A memory array comprising:
   a plurality of F-RAM cells of said memory array;
   a first bitline and a second bitline coupled to said plurality of F-RAM cells;
   a first current mirror coupled to said first bitline;
   a first local I/O coupled to said first current mirror;
   a second current mirror coupled to said second bitline;
   a second local I/O coupled to said second current mirror;
   a current mirror common node line that is connected to a first current mirror transistor whose gate is also connected to said first bitline, said current mirror common node also being connected to a third current mirror transistor whose gate is also connected to said second bitline; and
   said first local I/O coupled to one input of a sense amp and said second local I/O coupled to the other input of said sense amp.

2. The memory array of claim 1 further comprising a first writeback transistor coupled between said first bitline and said second local I/O, and a second writeback transistor coupled between said second bitline and said first local I/O.

3. The memory array of claim 1 where said sense amp is coupled to a column of said plurality of F-RAM cells.

4. The memory array of claim 1 wherein said first current mirror and said second current mirror are coupled to ground.

5. The memory array of claim 1 wherein said first current mirror and said second current mirror are coupled to a negative voltage generator.

6. The memory array of claim 1 wherein said first current mirror transistor couples said first current mirror to said first bitline and a second current mirror transistor couples said first current mirror to said first local I/O, and further where a channel width of said first current mirror transistor is less than or equal to a channel width of said second current mirror transistor.

7. The memory array of claim 6 wherein said third current mirror transistor couples said second current mirror to said second bitline, and a fourth current mirror transistor couples said second current mirror to said second local I/O, and further where a channel width of said third current mirror transistor is the same as said channel width of said first current mirror transistor and a channel width of said fourth current mirror transistor is the same as said channel width of said second current mirror transistor.

8. The memory array of claim 1 wherein a YSEL line couples said first local I/O to a second current mirror transistor located within said first current mirror, and said YSEL line couples said second local I/O to a fourth current mirror transistor located within said second current mirror.

9. The memory array of claim 1 wherein several rows of said F-RAM cells share a common plateline driver.

10. The memory array of claim 1 wherein a wordline is connected to a cell select transistor within each of said plurality of F-RAM cells that are located within a row of said memory array.

* * * * *